(12) United States Patent
Winter et al.

(10) Patent No.: US 10,518,295 B2
(45) Date of Patent: Dec. 31, 2019

(54) METHOD FOR CONTAINING A FLUID VOLUME IN AN INLINE CONVEYORIZED CLEANER FOR CLEANING LOW STANDOFF COMPONENTS

(71) Applicants: Douglas Norman Winter, Torrance, CA (US); Julio Montjoy, Torrance, CA (US); Primitivo Trinidad, Jr., Corona, CA (US)

(72) Inventors: Douglas Norman Winter, Torrance, CA (US); Julio Montjoy, Torrance, CA (US); Primitivo Trinidad, Jr., Corona, CA (US)

(73) Assignee: Technical Devices Company, Torrance, CA (US)

( * ) Notice: Subject to any disclaimer, the term of this patent is extended or adjusted under 35 U.S.C. 154(b) by 752 days.

(21) Appl. No.: 13/781,577

(22) Filed: Feb. 28, 2013

(65) Prior Publication Data
US 2013/0319479 A1    Dec. 5, 2013

Related U.S. Application Data

(60) Provisional application No. 61/653,877, filed on May 31, 2012.

(51) Int. Cl.
*B08B 3/04* (2006.01)
*B08B 3/10* (2006.01)
(Continued)

(52) U.S. Cl.
CPC .............. *B08B 3/041* (2013.01); *B08B 3/04* (2013.01); *B08B 3/10* (2013.01);
(Continued)

(58) Field of Classification Search
CPC .. B08B 3/04; B08B 3/10; B08B 3/041; H05K 3/26; H01L 21/67051; H01L 21/67057; H01L 21/02041; C23G 3/024
(Continued)

(56) References Cited

U.S. PATENT DOCUMENTS 3,868,272 A * 2/1975 Tardoskegyi ............ H05K 3/26
                                                    134/131
4,270,317 A * 6/1981 Kurie .................... A61L 9/01
                                                    134/64 R
(Continued)

FOREIGN PATENT DOCUMENTS

WO        WO-8702213 A1 *  4/1987  ............... B08B 3/02

OTHER PUBLICATIONS

Machine translation of WO-8702213-A1, dated Apr. 1987. (Year: 1987).*

*Primary Examiner* — Joseph L. Perrin
*Assistant Examiner* — Kevin G Lee
(74) *Attorney, Agent, or Firm* — Buche & Associates, P.C.; John K. Buche; Bryce A. Johnson

(57) ABSTRACT

In one embodiment, the disclosed apparatus features a conveyor belt though an agitated reservoir of cleaning solution that is pooled by a flood box defined by sidewalls along the sides of the conveyor belt and opposing jets of water dubbed water curtains at the entrance and exit of the conveyor belt to and from the flood box, and, agitated by a plurality of spray nozzles shooting high flows of cleaning solution into the reservoir from above or within the flood box. The conveyor belt may be horizontal or slightly angled from the horizontal relative to the flood box.

1 Claim, 5 Drawing Sheets

(51) Int. Cl.
*H01L 21/67* (2006.01)
*H05K 3/26* (2006.01)

(52) U.S. Cl.
CPC ......... *H01L 21/67051* (2013.01); *H05K 3/26* (2013.01); *B08B 3/102* (2013.01); *H05K 2201/2036* (2013.01); *H05K 2203/0743* (2013.01); *H05K 2203/0766* (2013.01); *H05K 2203/1545* (2013.01)

(58) Field of Classification Search
USPC .............................................. 134/131, 73–75
See application file for complete search history.

(56) References Cited

U.S. PATENT DOCUMENTS

| | | | | |
|---|---|---|---|---|
| 4,696,226 A | * | 9/1987 | Witmer | C21D 1/74 432/64 |
| 4,724,856 A | * | 2/1988 | Pender | C23F 1/08 118/405 |
| 4,928,717 A | * | 5/1990 | Osarek | C23G 3/024 134/122 R |
| 4,964,365 A | * | 10/1990 | D'Amato | C23F 1/08 118/419 |
| 5,045,120 A | * | 9/1991 | Mittag | H05K 3/26 134/21 |
| 5,994,782 A | * | 11/1999 | Chu | C25D 17/00 134/22.1 |
| 7,011,714 B2 | * | 3/2006 | Schuler | C23G 3/024 134/122 R |
| 7,946,302 B2 | * | 5/2011 | Wallace | B05C 3/10 134/124 |
| 2006/0281326 A1 | * | 12/2006 | Ose | H01L 21/67051 438/745 |
| 2008/0000873 A1 | * | 1/2008 | Mazzara | H01L 31/18 216/13 |

* cited by examiner

METHOD FOR CONTAINING A FLUID VOLUME IN AN INLINE CONVEYORIZED CLEANER FOR CLEANING LOW STANDOFF COMPONENTS

CROSS-REFERENCE TO RELATED APPLICATIONS

This application claims the benefit and priority of U.S. Prov. Pat. App. Ser. No. 61/653,877 (filed May 31, 2012) entitled: "Method for containing a fluid volume in an in-line conveyorized cleaner for cleaning low standoff components."

STATEMENT REGARDING FEDERALLY SPONSORED RESEARCH OR DEVELOPMENT

Not applicable.

BACKGROUND OF THE INVENTION

Printed circuit boards frequently have low-standoff components (i.e., components with low clearance from the board or other components) that are difficult to clean. This difficulty of cleaning low-standoff components arises because cleaning solutions, whether water or chemical based, cannot easily be provided to underneath the components. Although difficult, effective cleaning of circuit boards entails cleaning underneath any low-standoff components. Given the difficulty of cleaning low-standoff components a tradeoff exists between quick and effective cleaning of circuit boards. This tradeoff can be illustrated with a comparison of two common cleaning methodologies, namely, spray and bath cleaning.

Spray cleaning involves passing circuit boards on a conveyor belt underneath spray nozzles of cleaning and rinsing solutions. Spray cleaning results in quick cleansing of circuit boards because many boards can be conveyed under the cleaner and rinse spray nozzles. However, at the same time, the sprayed cleaning solution usually does not provide enough force to overcome the surface tension under the low-standoff components to remove flux or other contaminants whereby spray cleaning is not effective.

Bath cleaning involves submerging a batch of circuit boards in a pool of cleaning solution, batch-by-batch. Bath cleaning, in contrast with spray cleaning, is effective because, over time, the cleaning solution is allowed to soak underneath the low-standoff components of the circuit board. Nonetheless, bath cleaning is not satisfactorily quick because soaking the circuit boards until underneath the low-standoff components is saturated with cleaning solution or rinse is a long process and, batch-by-batch circuit board cleaning is tedious.

In view of the foregoing, spray and bath cleaning methodologies and related apparatus are not entirely suited to cleaning circuit boards. In other words, a need exists for circuit board cleaning apparatus and related methods of use that are quick yet effective. Specifically, a need exists for apparatus and related methods of quickly cleaning circuit boards so that the entirety of any low-standoff components is cleaned.

SUMMARY OF THE INVENTION

An objective of this disclosure is to describe apparatus and related methods of quickly cleaning circuit boards, including underneath the boards' low-standoff components.

In one embodiment, the disclosed apparatus features a conveyor belt through an agitated reservoir of cleaning solution that is
(1) pooled by a flood box defined by
 (a) sidewalls along the sides of the conveyor belt and
 (b) opposing jets of water (dubbed water curtains) at the entrance and exit of the conveyor belt to and from the flood box; and,
(2) agitated by a plurality of spray nozzles shooting high flows of cleaning solution into the reservoir from above or within the flood box. The conveyor belt may be horizontal or slightly angled from horizontal relative to the flood box.

In operation, circuit boards are provided to the agitated reservoir of cleaning solution via the conveyor belt. Suitably, the boards on the conveyor are submerged whereby the agitated solution can flood underneath the low standoff components.

BRIEF DESCRIPTION OF THE FIGURES

The manner in which these objectives and other desirable characteristics can be obtained is explained in the following description and attached figures in which.

It is to be noted, however, that the appended figures illustrate only typical embodiments of the disclosed apparatus and methods, and therefore, are not to be considered limiting of their scope, for the disclosed apparatus and methodologies may admit to other equally effective embodiments that will be appreciated by those reasonably skilled in the relevant arts. Also, figures are not necessarily made to scale.

DETAILED DESCRIPTION OF THE PREFERRED EMBODIMENTS

Generally described are apparatus and related methods of quickly cleaning circuit boards, including underneath any low-standoff components. In a preferred embodiment, the disclosed apparatus features a conveyor belt through an agitated reservoir of cleaning solution that is (1) pooled in a flood box defined by (a) a bottom pan positioned underneath the conveyor belt with opposing ends and sides, (b) sidewalls extending upward along the sides of the conveyor belt, and (c) opposing jets of water (dubbed water curtains) at the entrance and exit of the conveyor belt over each opposite ends of the pan; and, (2) agitated by a plurality of spray nozzles shooting powerful flows of cleaning solution into the reservoir from above or within the flood box pan. The conveyor belt may be horizontal or slightly angled from horizontal relative to the flood box. The more specific features of the disclosed apparatus are disclosed with reference to the figures.

Figure 1:
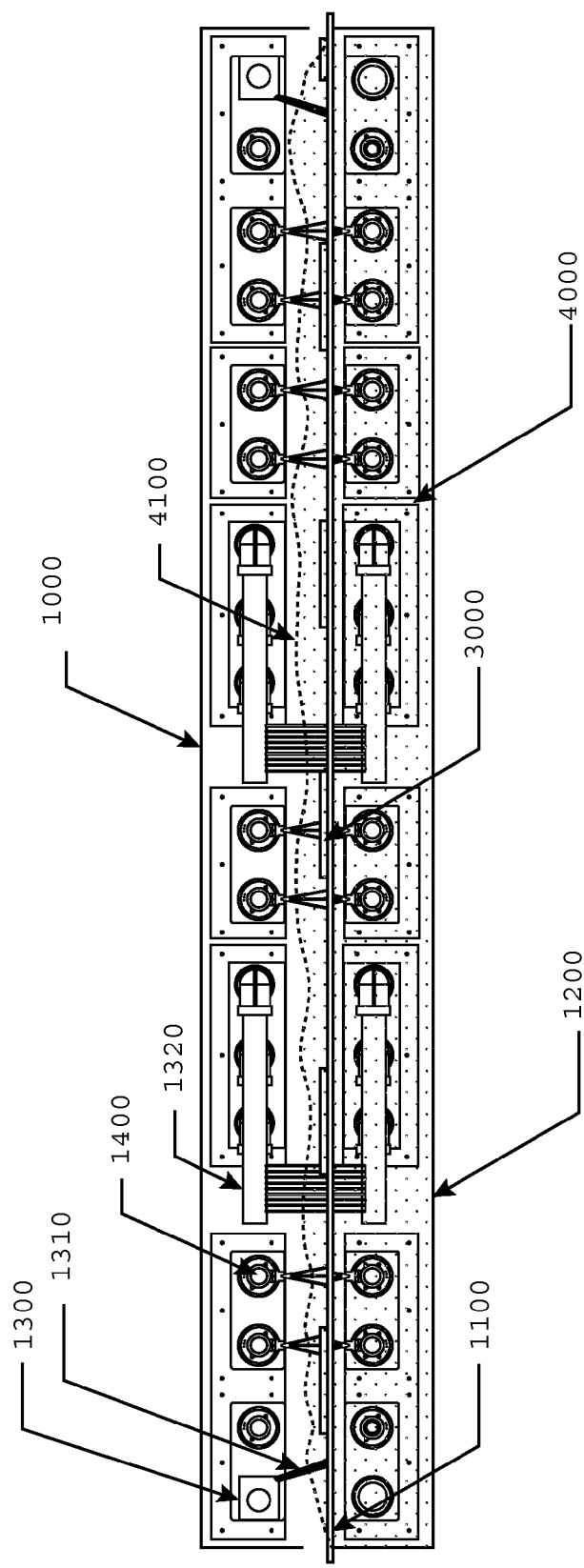
FIG. 1 cross section of a flood box 1000.
Figure 2:
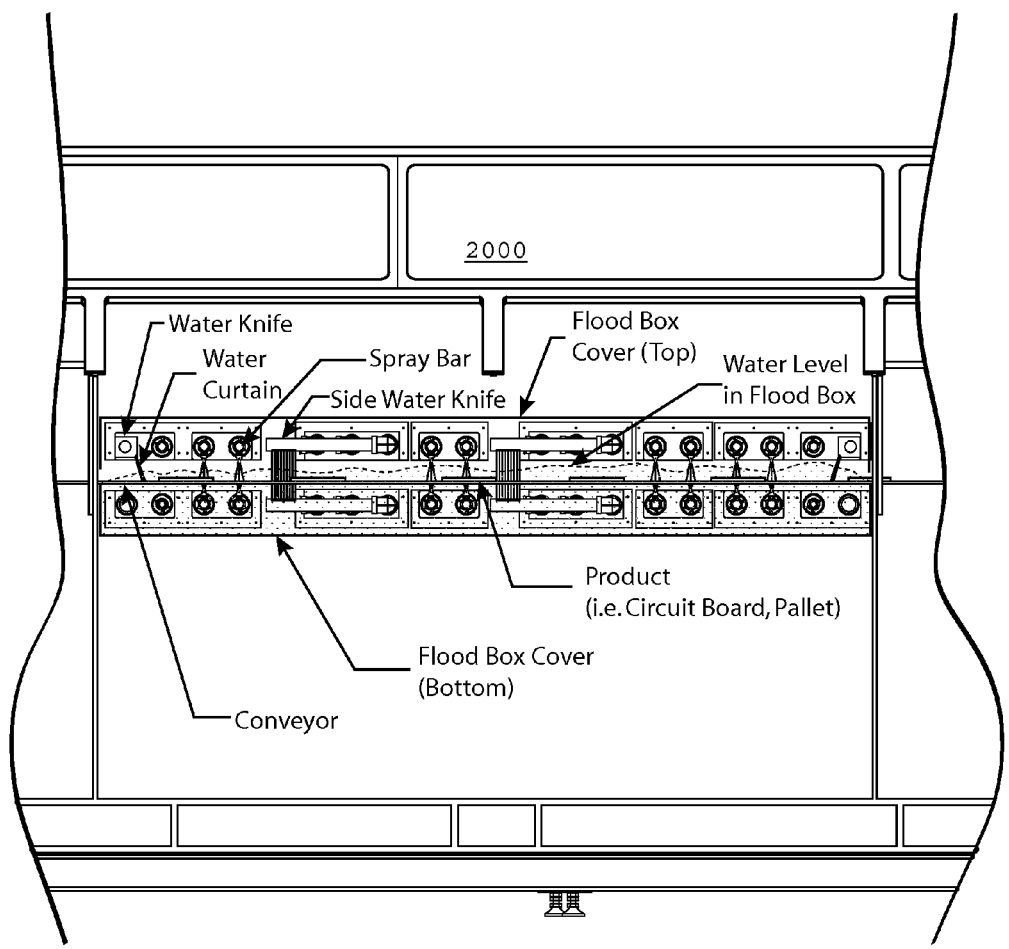
FIG. 2 is a contextual view of the flood box of FIG. 1 disposed in a cleaning apparatus 2000.
Figure 3:
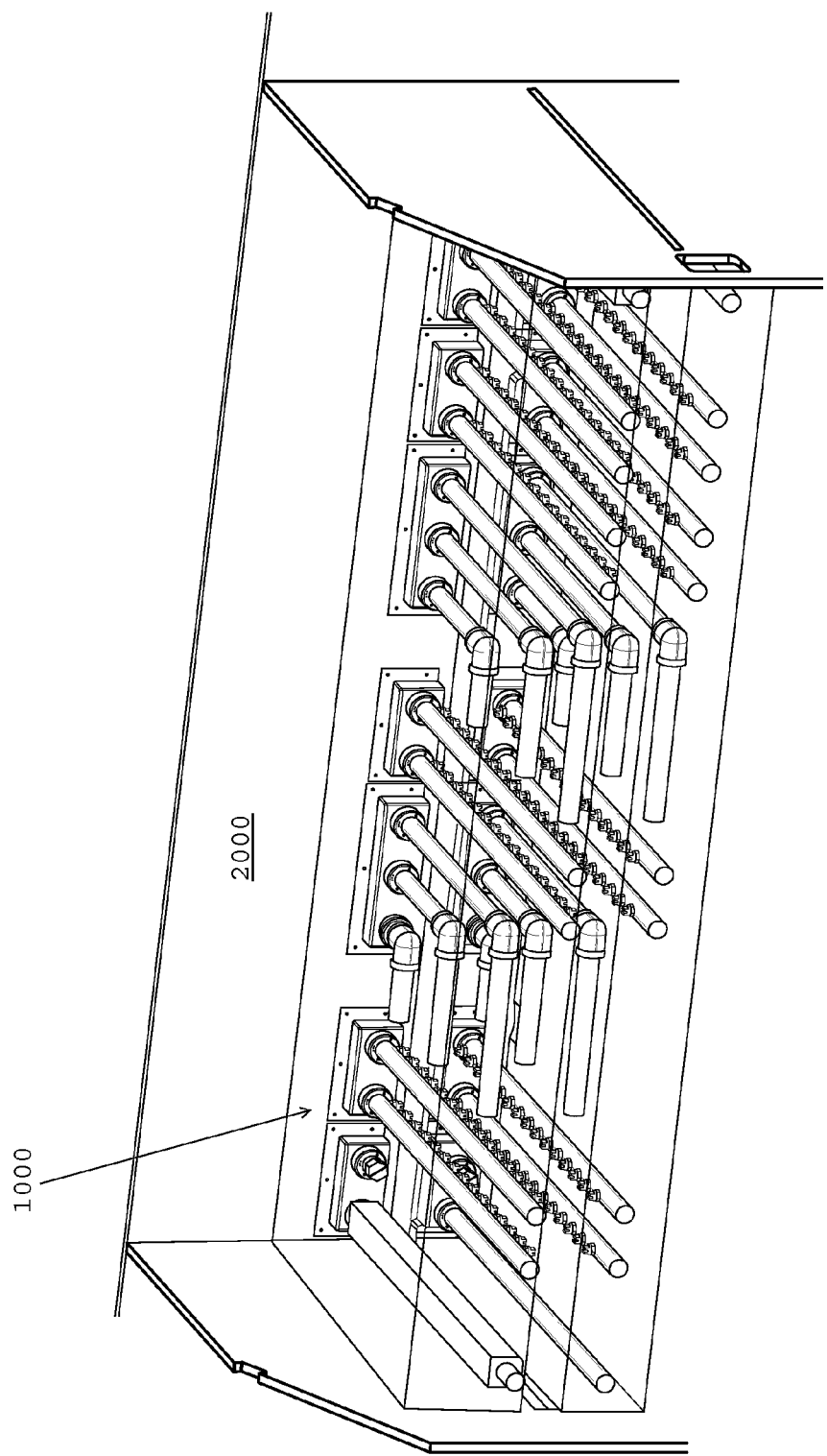
FIG. 3 is a perspective view of the flood box 1000 inside a cleaning apparatus.

FIG. 1 is a cross section of a preferred flood box 1000. As shown, the box features: a horizontal or slightly angled (±10 deg. relative to the horizontal), left-to-right conveyor belt 1100; a bottom pan 1100 with four walls, namely two side walls that extend upwardly past the conveyor belt and two ends that truncate just below the conveyor belt 1100; a left-to-right conveyor belt 1200 positioned above the pan 1100; to water jets 1300, one positioned above one end of the bottom pan and the other positioned above the other end of the bottom pan, said water jets 1300 configured to forcefully spray cleaning solution in the form of a curtain 1310 toward the center of the flood box 1000; a plurality of upper and lower lined spray nozzles 1400 spread out lengthwise along the conveyor belt and configured to spray cleaning solution into the flood box 1000; and a reservoir 4000 of cleaning solution that is disposed within the pan at a level that is above the conveyor belt and that is prevented from flooding over the ends via the curtain 1310. FIG. 2 is a contextual view of the flood box 1000 provided to within a cleaning apparatus 2000. FIG. 3 is a perspective view of the flood box 1000. It should be noted that ultra-sonics could be added to the flood box 1000 for enhanced cleaning.

Figure 4:
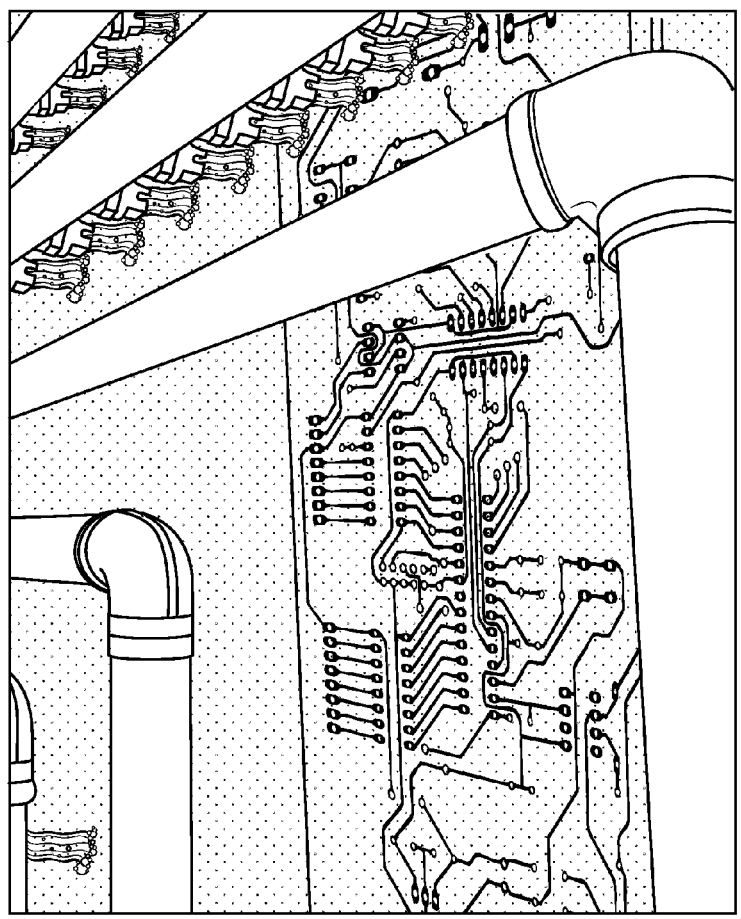
FIG. 4 is a contextual image of a circuit board passing through the flood box 1000.

Referring to FIGS. 1 through 3, the flood box generally operates by conveying circuit boards 3000 from left to right across the flood box 1000. Suitably, a reservoir 4000 of cleaning solution is provided to within the flood box 1000 (e.g., by spray nozzles 1320 at various intervals across the flood box 1000) to a level 4100 that is higher than the conveyor belt 1100. Suitably, the reservoir 4000 of cleaning solution is retained within the flood box 1000 without spilling out over the ends of the bottom pan 1200 (which ends are below the level 4100 of the reservoir) via the water curtains 1310, which are jets of water directed inward of the flood box 1000. In operation, circuit boards 3000 are placed on the conveyor belt 1100 and conveyed through the reservoir wherein the circuit boards are submerged in the reservoir 4000 upon passage through the entrance curtain 1310. Suitably, the reservoir 4000 is agitated by a plurality of spray nozzles or bars 1400 which spray water into the reservoir 4000. The agitated reservoir 4000 readily floods underneath any low-standoff components of the circuit boards 3000. FIG. 4 is a close up image of a circuit board 3000 that is submerged under the agitated reservoir 4000. Suitably, the length of the flood box can be calibrated or adjusted to accommodate various clean times or cleanliness standards.

Figure 5:
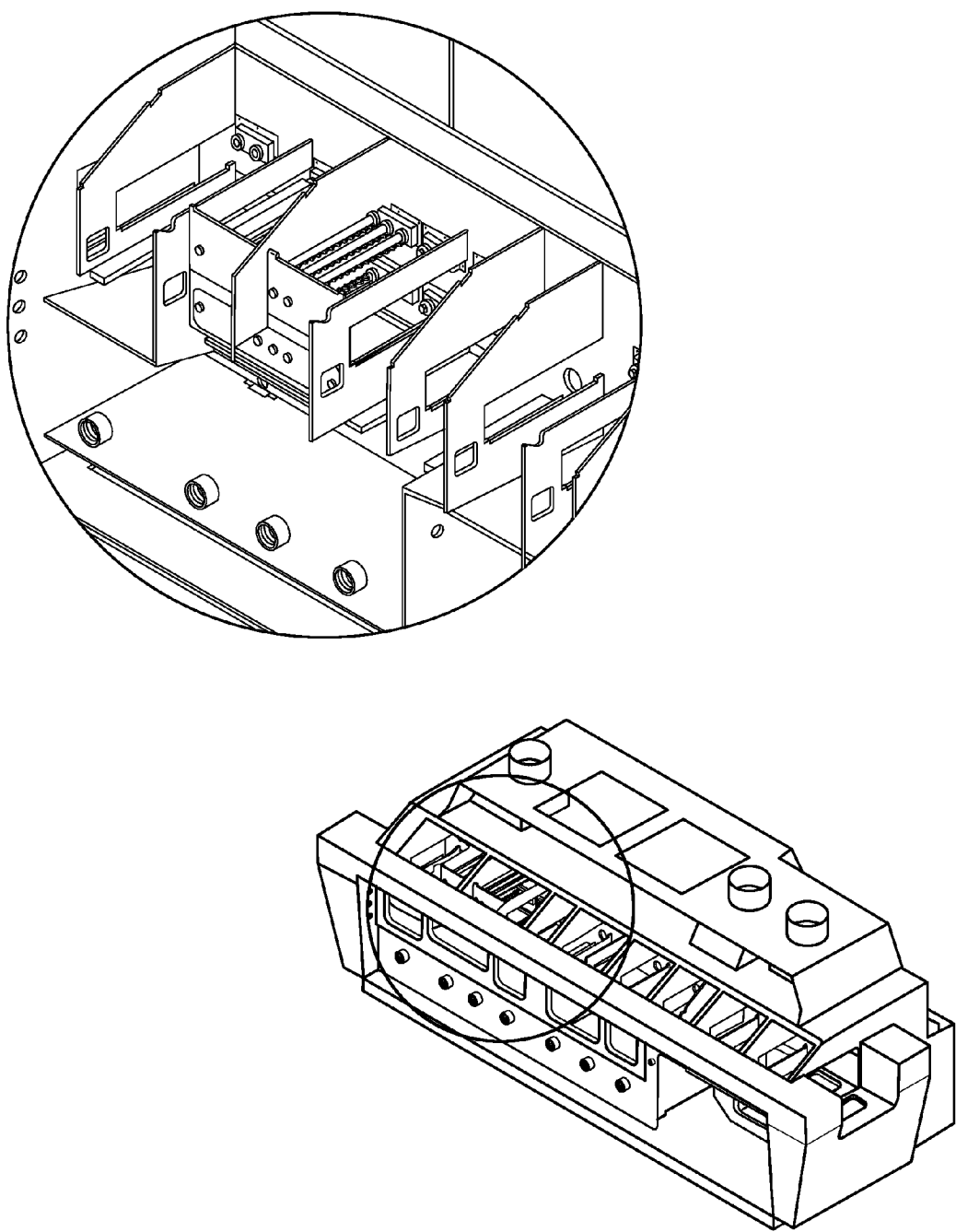
FIG. 5 is an image of a cleaning apparatus 2000 fitted with a flood box 1000.

It should be noted that a plurality of flood boxes 1000 can be positioned in series to accomplish various cleaning tasks. For instance, a series of three flood boxes 1000 may be constructed wherein the first flood box features a reservoir of preparation solution, second flood box features a reservoir of cleaning solution, and the third flood box features a reservoir of rinse solution. In other words, various processes can be accomplished via constructing several flood-boxes in series. An example of an apparatus with multiple flood boxes in series is provided as FIG. 5. In that figure, the cleaning flood box is blown-out in a circle.

In one mode of construction, a flood box may be fabricated by: first, adding water jets for water curtains at the entrance and exit ends of the conveyor belt; second, providing a bottom pan such that the conveyor passes through the ends and along the sides; third, adding spray bards above and below the fluid level inside the flood box; and fourth, providing a reservoir to within the flood box.

The disclosed apparatus may be constructed of any suitable materials and methodologies known for circuit board cleaners. It should be noted that FIGS. 1 through 5 and the associated description are of illustrative importance only. In other words, the depiction and descriptions of the present disclosure should not be construed as limiting of the subject matter in this application. Additional modifications may become apparent to one skilled in the art after reading this disclosure.

We claim:
1. An apparatus comprising:
   a conveyor belt through a flood box, where the conveyor belt has a top conveying surface at a level, where the level of the conveyor belt is angled relative to the horizontal at a plus or minus ten degree angle, and where at least one circuit board is placed on the top conveying surface of the conveyor belt;
   a reservoir of cleaning solution
   (1) that is provided to within the flood box by a plurality of upper and lower side water knives oriented lengthwise along the conveyor belt at various intervals across the conveyor belt, said cleaning solution provided by the side water knives to a cleaning solution level that is higher than the level of the top conveying surface of the conveyor belt so that the at least one circuit board is submerged,
   (2) that is pooled to said cleaning solution level that is higher than the level of the top conveying surface of the conveyor belt by said side water knives, said reservoir confined within said flood box defined by
      (a) a bottom pan with two sidewalls and two ends, wherein said sidewalls are positioned along the sides of a portion of the conveyor belt so that the side walls extend upwardly past the level of the top conveying surface of the conveyor belt, and wherein said two ends are truncated just below the conveyor belt so that said portion of the conveyor belt is operably positioned above the bottom pan, over the ends, and between the side walls,
      (b) opposing jets of water oriented widthwise relative to the conveyor belt, a first of said opposing jets of water positioned above a first one of said two ends of the bottom pan and a second of said opposing jets of water positioned above a second one of said two ends of the bottom pan, wherein said first and second ones of said opposing jets forcefully spray cleaning solution in the form of a curtain toward the center of the flood box so that the reservoir of cleaning solution is
         (i) disposed within the bottom pan so that the cleaning solution level is above the level of the top conveying surface of the conveyor belt and
         (ii) impinged by the curtains from flooding over the first and second ends via the curtains from said first and second jets and said sidewalls,
   (3) that is agitated by a plurality of upper and lower lined spray nozzles that are oriented widthwise relative to the conveyor belt spread out lengthwise along the conveyor belt and configured to spray cleaning solution into the flood box at high flows into the reservoir from above or within the flood box, and,
   (4) that is agitated by the plurality of upper and lower side water knives that are oriented lengthwise relative to the conveyor belt and spread out lengthwise and widthwise along the conveyor belt and configured to spray cleaning solution into the flood box at high flows into the reservoir from above or within the flood box;
   and,
   wherein the circuit board is firstly conveyed on the top conveying surface of the conveyor belt through the first of the opposing jets of water to enter said flood box, secondly conveyed along said portion of the conveyor belt while submerged within the reservoir and while the cleaning solu- tion is agitated, and thirdly conveyed through the second of the opposing jets of water to exit the flood box;

wherein a first set of lined spray nozzles is defined by two of said plurality of upper lined spray nozzles plus two of said lower lined spray nozzles, wherein a second set of lined spray nozzles is defined by two more of said plurality of upper lined spray nozzles plus two more of said lower lined spray nozzles, wherein a first set of water knives is defined by three of said plurality of upper side water knives plus three of said lower side water knives, and wherein a second set of water knives is defined by three more of said plurality of upper side water knives plus three more of said lower side water knives, and wherein (a) the first set of lined spray nozzles is positioned within the flood box between (i) the first of said opposing jets positioned above the first one of said two ends of the bottom pan and (ii) the first set of water knives, (b) the first set of water knives is positioned within the flood box between the first and second sets of lined spray nozzles, (c) the second set of lined spray nozzles is positioned within the flood box between the first and second sets of water knives, (d) and the second set of water knives is positioned within the flood box at least between (i) the second set of water knives and the second of said opposing jets positioned above the second one of said two ends of the bottom pan.

* * * * *